(12) United States Patent
Yager et al.

(10) Patent No.: US 8,773,636 B2
(45) Date of Patent: Jul. 8, 2014

(54) OPTICAL LITHOGRAPHY USING GRAPHENE CONTRAST ENHANCEMENT LAYER

(71) Applicant: Empire Technology Development, LLC, Wilmington, DE (US)

(72) Inventors: Thomas A. Yager, Encinitas, CA (US); Seth Adrian Miller, Englewood, CO (US)

(73) Assignee: Empire Technology Development, LLC, Wilmington, DE (US)

( * ) Notice: Subject to any disclaimer, the term of this patent is extended or adjusted under 35 U.S.C. 154(b) by 0 days.

(21) Appl. No.: 13/950,923

(22) Filed: Jul. 25, 2013

(65) Prior Publication Data

US 2013/0309462 A1 Nov. 21, 2013

Related U.S. Application Data

(62) Division of application No. 12/999,141, filed on Dec. 15, 2010, now Pat. No. 8,512,936.

(51) Int. Cl.
*G03F 7/20* (2006.01)
*G03F 7/38* (2006.01)
*G03B 27/52* (2006.01)

(52) U.S. Cl.
USPC ............ 355/53; 355/77; 430/327; 428/634

(58) Field of Classification Search
USPC .................. 355/53, 77; 430/327; 428/634
See application file for complete search history.

(56) References Cited

U.S. PATENT DOCUMENTS

| 4,849,323 | A | 7/1989 | Endo et al. |
| 6,806,996 | B2 | 10/2004 | Tatsuura et al. |
| 7,022,452 | B2 | 4/2006 | Lu |
| 2009/0220756 | A1 | 9/2009 | Chen et al. |
| 2009/0253072 | A1 | 10/2009 | Petruska et al. |
| 2009/0308520 | A1 | 12/2009 | Shin et al. |
| 2011/0200787 | A1* | 8/2011 | Regan et al. ............... 428/138 |

FOREIGN PATENT DOCUMENTS

| JP | 61275839 | 12/1986 |
| JP | 06104256 | 4/1994 |

OTHER PUBLICATIONS

Bao et al., Atomic-Layer Graphene as a Saturable Absorber for Ultrafast Pulsed Lasers, Adv. Funct. Matter., 2009, 19; 3077-3083.
Yamaguchi et al., Highly Uniform 300 mm Water-Scale Deposition of Single and Multilayered Chemically Derived Graphene Thin Films, ACS Nano, 2010, 4, 1, p. 1-16.
Lin et al., 100-GHz Transistors from Wafer-Scale Epitaxial Graphene, Science Magazine, 2010, 327, p. 662.

(Continued)

*Primary Examiner* — Evan Pert
(74) *Attorney, Agent, or Firm* — Moritt Hock & Hamroff LLP; Steven S. Rubin, Esq.

(57) ABSTRACT

Technologies are generally described for methods, systems, and structures that include patterns formed by optical lithography. In some example methods, a photoresist layer is applied to a substrate, and a grapheme layer can be applied to the photoresist layer. Light can be applied through a mask to the graphene layer, where the mask includes a pattern. The light can form the pattern on the graphene layer such that the pattern forms on the photoresist layer.

21 Claims, 4 Drawing Sheets

(56) References Cited

OTHER PUBLICATIONS

Contrast Enhancement Materials, ShinEtsuMAicroSi, retrieved from www.microsi.com/photolightography/data_sheets, 2004, 9 pages.
Saturable Absorption, Wikipedia, retrieved from http://en.wikipedia.org/wiki/Saturable_absorption on Jan. 20, 2011, 5 pages.
Bae et al., Roll-to-Roll production of 30-inch graphene films for transparent electrodes, Nature Nanotechnology, p. 1-5.
International Search report for PCT application PCT/US2010/050668, dated Nov. 8, 2010, 3 pages.
International Written Opinion for PCT application PCT/US2010/050668, dated Nov. 8, 2010, 4 pages.
Geary et al., Contrast Enhancement Materials for Yield Improvement in Submicron I-line Lithography, Proceedings of SPIE, 2002, pp. 1-10, 4689.
Zhang et al., Graphene mode locked, wavelength-tunable, dissipative soliton fiber laser, Appl. Phys. Lett., 2010, p. 111112-1-111112-3.
Kim et al., Application of contrast enhancement layer to 193 nm lithography, J. Vac. Sci. Technol. B, 2007, 5 pages, 25 (6).
Graphene, Wikipedia, retrieved from wikipedia.org/wiki/Graphene on Aug. 13, 2010, 17 pages.

\* cited by examiner

OPTICAL LITHOGRAPHY USING GRAPHENE CONTRAST ENHANCEMENT LAYER

CROSS REFERENCE TO RELATED APPLICATIONS

This application is a divisional of application Ser. No. 12/999,141 filed Dec. 15, 2010, the entirety of which is hereby incorporated by reference.

BACKGROUND

Unless otherwise indicated herein, the materials described in this section are not prior art to the claims in this application and are not admitted to be prior art by inclusion in this section.

In optical lithography, a pattern may be formed on a substrate using a mask. In some examples, a light sensitive photoresist layer may be applied to the substrate. A light source may apply a beam of light to the substrate through the mask. The pattern on the mask may cause the light beam to expose some areas of the photoresist and block other areas of the photoresist from exposure based on the pattern. The photoresist may react to the applied light to form the pattern on the substrate. An optical system may be interposed between the mask and the substrate allowing for changes in a size of the pattern exposed to the photoresist layer.

SUMMARY

Technologies are generally described for methods, systems and structures that include vias formed by optical lithography.

In some examples, a method for forming a structure is generally described. Example methods may include applying a photoresist layer on a substrate, and applying a graphene layer on the photoresist layer. In some examples, the method may further include applying light through a mask to the graphene layer, where the mask includes a pattern. The applied light can form the pattern on the graphene layer and such that the pattern forms on the photoresist layer.

In some examples, a structure is generally described. Example structures may include a substrate with a photoresist layer on the substrate. The structure may further include a graphene layer on the photoresist layer.

In some examples, a system effective to form a structure is generally described. An example system may include a processor, a light source, a mask, a substrate, a photoresist layer, and a graphene layer. The photoresist layer can be formed on the substrate, with the graphene layer formed on the photoresist layer. The processor can be arranged in communication with the lights source, and configured effective to apply light through the mask to the graphene layer. In some examples, the light is effective to form the pattern on the graphene layer such that the pattern can be formed on the photoresist layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
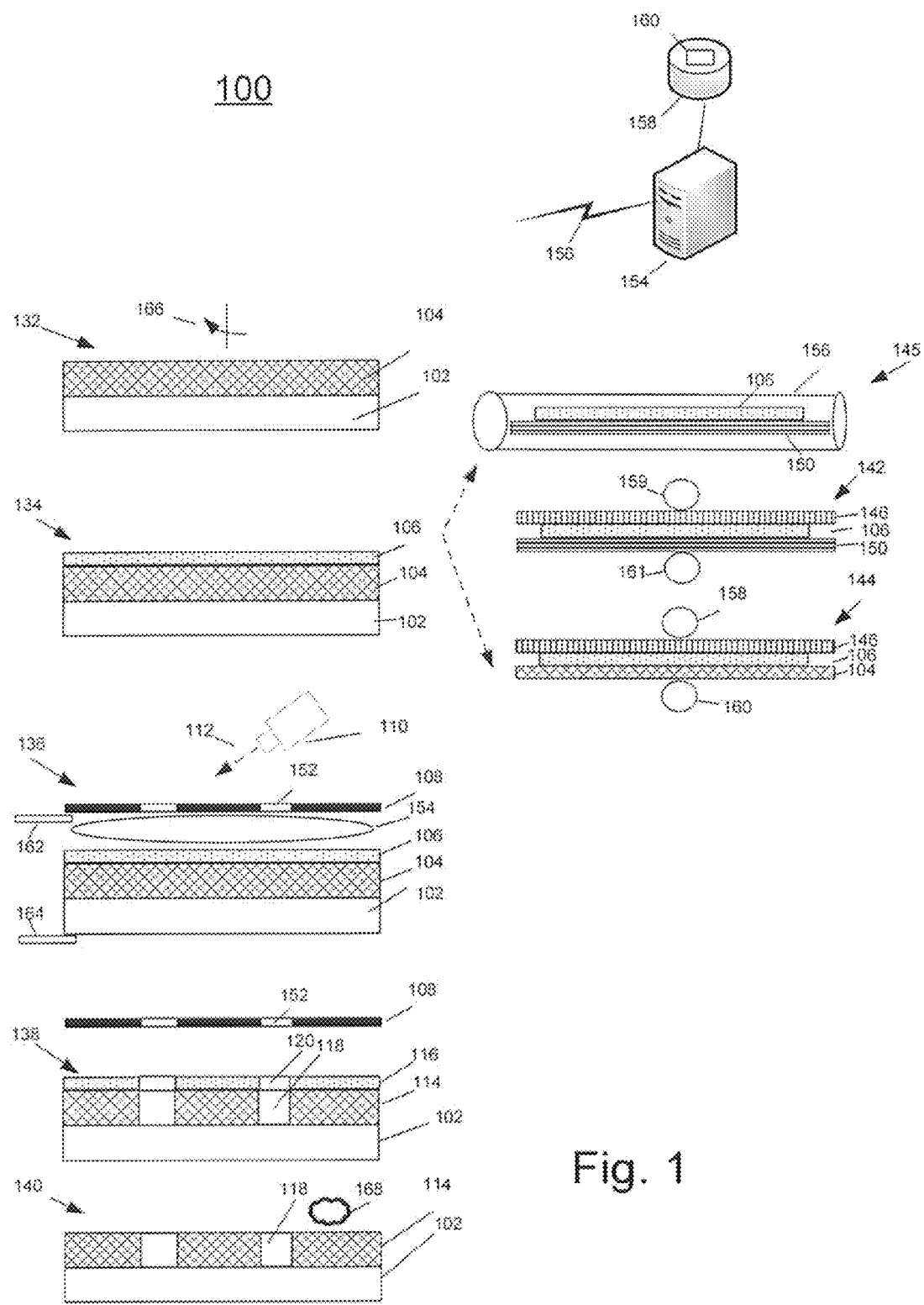
FIG. 1 illustrates an example system that can be utilized to implement optical lithography using a graphene contrast enhancement layer.

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described to the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to systems, methods, materials and apparatus related to optical lithography using a graphene contrast enhancement layer.

Briefly stated, technologies are generally described for methods, systems, and structures that include patterns formed by optical lithography. In some example methods, a photoresist layer is applied to a substrate, and a graphene layer can be applied to the photoresist layer. Light can be applied through a mask to the graphene layer, where the mask includes a pattern. The light can form the pattern on the graphene layer such that the pattern forms on the photoresist layer.

It will also be understood that any compound, material or substance which is expressly or implicitly disclosed in the specification and/or recited in a claim as belonging to a group or structurally, compositionally and/or functionally related compounds, materials or substances, includes individual representatives of the group and all combinations thereof.

FIG. 1 illustrates an example system that can be utilized to implement optical lithography using a graphene contrast enhancement layer, in accordance with at least some embodiments described herein. An example optical lithography system 100 may include a substrate 102, a photoresist layer 104, a graphene layer 106, a light source 110, an optical system 154, and/or a mask 108. At least some of these elements may be arranged in communication with a processor 154 through a communication link 156. In some examples, processor 154 may be in adapted in communication with a memory 158 that includes instruction 160 stored therein. Processor 154 may be configured (e.g., by instructions 160) to control at least some of the operations described below.

In some examples, substrate 102 may be a silicon wafer, GaAs, or other semiconductor wafers. As shown at 132 of FIG. 1, photoresist layer 104 may be applied on substrate 102. In various examples, the photoresist layer 104 may be applied by spin coating as shown at 166 or by some other method. As shown at 134, a graphene layer 106 may be applied on photoresist layer 104. The graphene layer 106 may be made of a graphene crystal of a width and length substantially matching photoresist layer 104. The graphene layer 106 may have a height of about one atom. In some examples, two or more graphene layers 106 may be used.

Graphene layer 106 may be applied on photoresist layer 104 in many ways. In some examples, as shown at 145, graphene layer 106 may be grown on a copper layer 150. Copper layer 150 may be inserted into a quartz tube 156 and heated to about 1000 degrees Celsius with flowing viscosity of 8 s.c.c.m (standard cubic centimeters per minute) $H_2$ at 90 mtorr. Thereafter, copper layer 150 may be annealed for about 30 minutes at a similar flow rate and pressure. A gas mixture of $CH_2$ and $H_2$ may then be flowed at about 460 mtorr with rates of about 24 s.c.c.m, and about 8 s.c.c.m for about 30 minutes, respectively. Copper layer 150 may then be cooled with flowing $H_2$ at about 10 degrees Celsius per second at a pressure of about 90 mtorr, thereby forming graphene layer 106.

As shown at 142, copper layer 150 may be attached to a polymer layer 146 such as with rollers 159,161. Copper layer 150 may then be dissolved and the combination of polymer layer 146 and graphene layer 106 may be rolled on to photoresist layer 104 using rollers 158, 160. In some examples, rollers 158, 159, 160, 161 may be in arranged in communication with processor 154. Thereafter, polymer layer 146 may be dissolved leaving graphene layer 106 applied on photoresist layer 104.

As shown at 136, in some examples, after application of graphene layer 106, the light source 110 may be configured to apply a light beam 112 to mask 108. Based on a pattern 152 on mask 108, at least some photons of light beam 112 may pass through mask 108, through optical system 154 and to graphene layer 106. In some examples, light source 110 may be configured to output light with a power greater than about 3 m W/cm$^2$. Mask 108 can be configured to block some photons of light beam 112 and allow other photons of light beam 112 to pass through based on pattern 152. In some examples, optical system 154 may be configured to retract light beam 112 to allow for a change in magnification of pattern 152 from mask 108 to graphene layer 106 and photoresist layer 104. Mask 108 and substrate 102 may be placed on respective tables 162, 164. In some examples, tables 162, 164 may be arranged in communication with processor 154 and may be movable with respect to each other.

As shown at 138, graphene layer 106 can receive photons from light beam 112, based on pattern 152, and allows photons to pass through thereby transmitting photonic energy to exposed graphene layer 116 in the desired pattern from mask 108. In these examples, when photonic energy from light beam 112 passes through graphene layer 106, photons from light beam 112 may expose the photoresist layer 104 resulting in a patterned photoresist layer 114 based on pattern 152. A structure may be formed including substrate 102, patterned photoresist layer 114 and exposed graphene layer 106.

As shown at 140, exposed graphene layer 116 may be removed from patterned photoresist layer 134. In some examples, the exposed graphene layer 16 may be removed using a dry etching technique such as through the application of an oxygen plasma 168. In some additional examples, photoresist layer 114 may include a silylating agent and may be compatible with such a dry etching technique.

Graphene layer 106 may be a saturable absorbing material so that, in examples where energy greater than a threshold is applied to graphene layer 106, the applied energy may pass through graphene layer 106. In some examples, graphene layer 106 may have a relatively low bandgap of approximately 0.1 EV so that virtually all photonic energy from light beam 112 passes through the graphene layer 106 to the photoresist layer 104.

In some examples, graphene Saver 106 may be effective to enhance a contrast of images patterned on photoresist 114 by sharpening peaks of light (e.g., photonic energy) passing through the graphene. For example, graphene layer 106 may be effective to provide sharp edge transitions on patterned photoresist layer 114 based on pattern 152 on mask 108 resulting in sharp transparent or opaque areas matching pattern 152.

Among other benefits, a system arranged in accordance with the present disclosure may be used with light sources with a wide variety of wavelengths. Example light sources may have wavelengths of about 193 nm, about 157 nm, and about 12 nm could be used. A system configured in accordance with the present disclosure may be used to enhance resolution of various features patterned on a substrate allowing for patterning of clear features of various sizes. The graphene layer may have a relatively small height. In some examples, the layer may be one atom in height. Graphene layer 106 may be reversible in that the layer can be used multiple times in multiple applications of light to a photoresist layer.

As the graphene layer may absorb incident light (i.e., absorb photons), the graphene layer may function as a top antireflective layer. Such an antireflective layer may inhibit light incident on the graphene layer from reflecting back into an optical system. Such a reflection may undesirably result in a double exposure of a photoresist layer.

Figure 2:
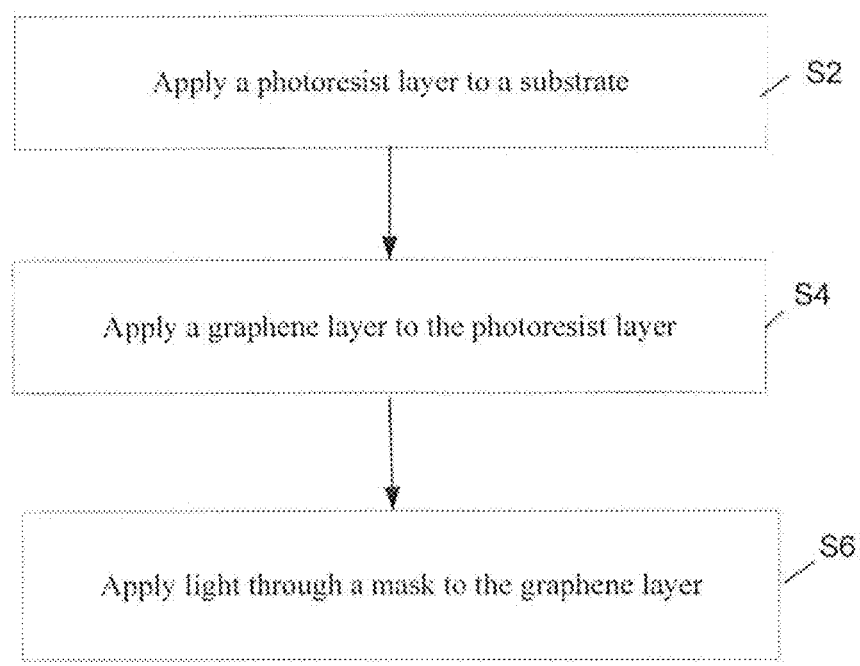
FIG. 2 depicts a flow diagram for an example process for implementing optical lithography using a graphene contrast enhancement layer.

FIG. 2 depicts a flow diagram for an example process 200 for implementing optical lithography using graphene as a contrast enhancement layer, arranged in accordance with at least some embodiments described herein. The process in FIG. 2 could be implemented using, for example, system 100 discussed above. An example process may include one or more operations, actions, or functions as illustrated by one or more of blocks S2, S4 and/or S6. Although illustrated as discrete blocks, various blocks may be divided into additional blocks, combined into fewer blocks, or eliminated, depending on the desired implementation. Process 200 may begin at block S2, "apply a photoresist to a substrate."

At block S2, a photoresist layer may be applied on a substrate. In some examples, the photoresist layer may be applied by pouring the photoresist on the substrate and spinning the substrate to cause the photoresist to coat the substrate. Processing may continue from block S2 to block S4, "apply a graphene layer to the photoresist layer."

At block S4, a graphene layer may be applied on the photoresist layer. In some examples, the graphene layer may be applied by rolling the photoresist layer using rollers. Processing may continue from block S4 to block S6, "apply light through a mask to the graphene layer."

At block S6, light may be applied through a mask to the graphene layer. In some examples, the light may be applied by a laser. The mask may include a pattern. By applying the light to the mask, a pattern of light can be transmitted through the graphene layer to expose the photoresist layer with the desired pattern.

Figure 3:
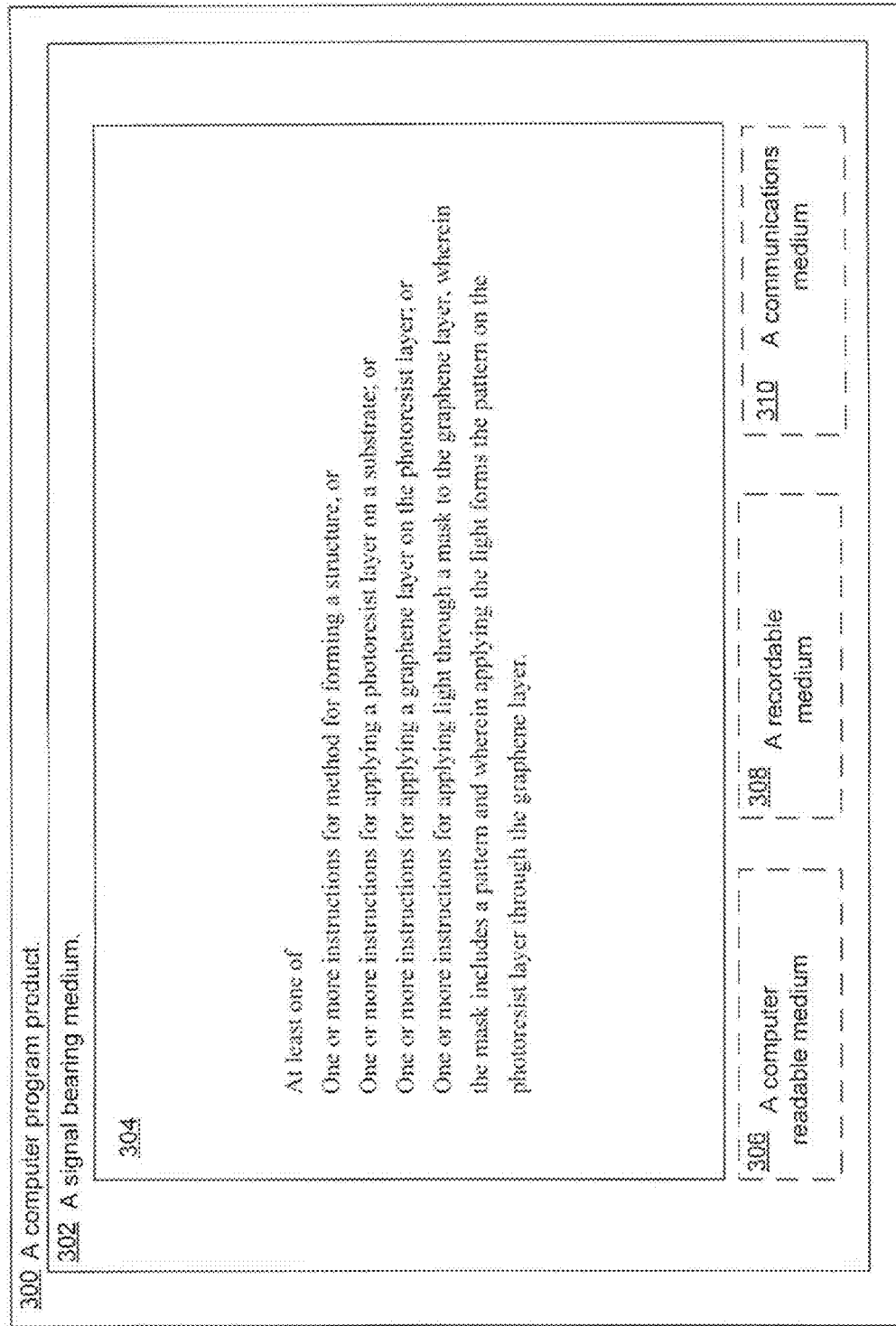
FIG. 3 illustrates a computer program product that can be utilized to implement optical lithography using a graphene contrast enhancement layer.

FIG. 3 illustrates a computer program product that can be utilized to implement optical lithography using a graphene contrast enhancement layer, in accordance with at least some embodiments described herein. Program product 300 may include a signal bearing medium 302. Signal bearing medium 302 may include one or more instructions 304 that, when executed by, for example, a processor, may provide the functionality described above with respect to FIGS. 1-2. Thus, for example, referring to system 100, processor 154 may undertake one or more of the blocks shown in FIG. 3 in response to instructions 304 conveyed to the system 100 by medium 302.

In some implementations, signal bearing medium 302 may encompass a computer-readable medium 306, such as, but not limited to, a hard disk drive, a Compact Disc (CD), a Digital Video Disk (DVD), a digital tape, memory, etc. In some implementations, signal bearing medium 302 may encompass a recordable medium 308, such as, but not limited to, memory, read/write (R/W) CDs, R/W DVDs, etc. In some implementations, signal bearing medium 302 may encompass a communications medium 310, such as, but not limited to, a digital and/or an analog communication medium (e.g., a fiber optic cable, a waveguide, a wired communications link, a wireless communication link, etc). Thus, for example, program product 300 may be conveyed to one or more modules of the system 100 by an RF signal bearing medium 302, where the signal bearing medium 302 is conveyed by a wireless communications median 310 (e.g., a wireless communications medium conforming with the IEEE 802.11 standard).

Figure 4:
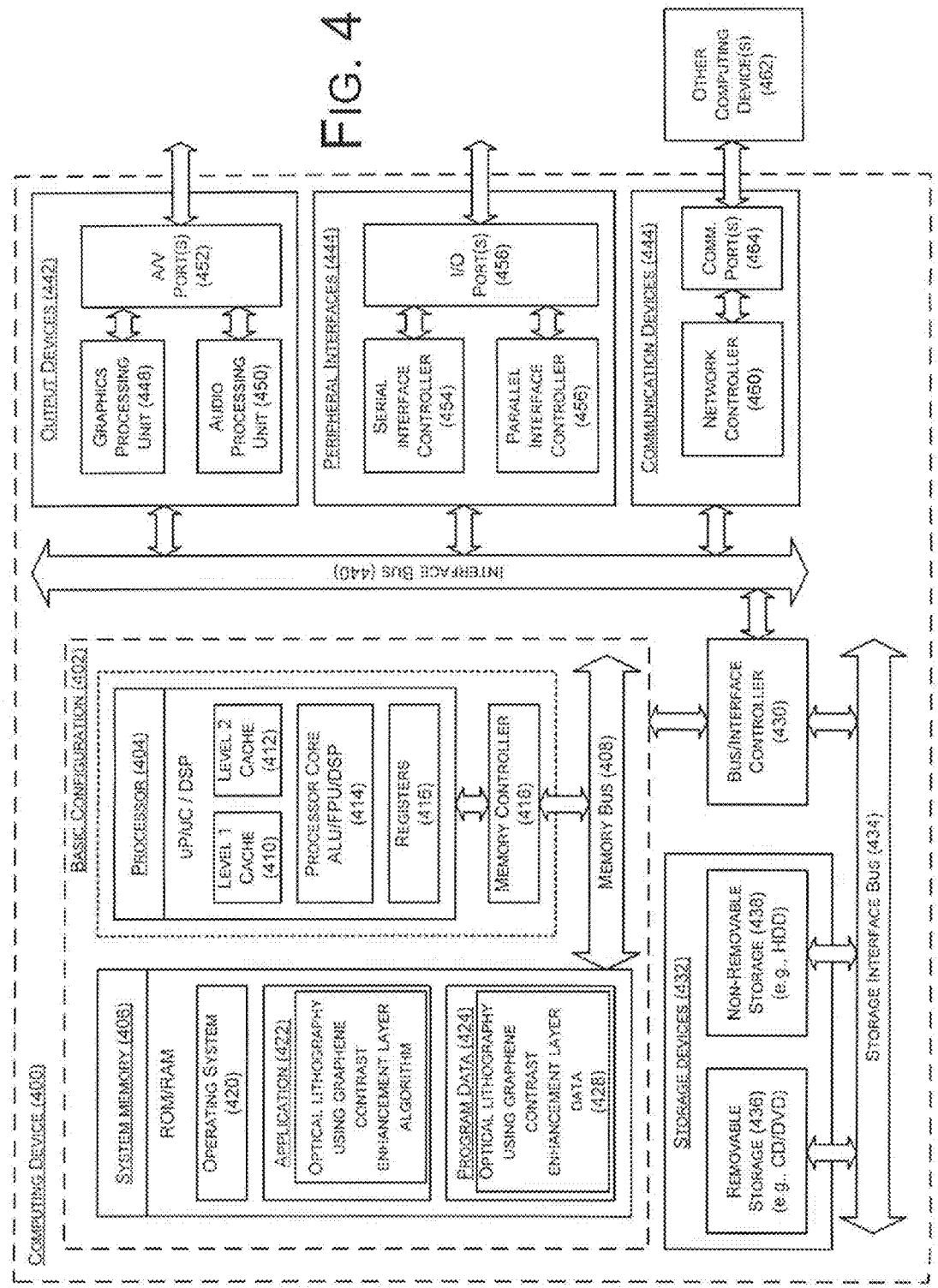
FIG. 4 is a block diagram illustrating an example computing device that is arranged to implement optical lithography using a graphene contrast enhancement layer.

FIG. 4 is a block diagram illustrating an example computing device that is arranged to implement optical lithography using a graphene contrast enhancement layer according to at least some embodiments described herein. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor (μP), a microcontroller (μC), a digital signal processor (DSP), or any combination thereof. Processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. An example memory controller 418 may also be used with processor 404, or in some implementations memory controller 418 may be an internal part of processor 404.

Depending on the desired configuration, system memory 406 may be of any type including but not limited to volatile memory (such as RAM), non-volatile memory (such as ROM, flash memory, etc.) or any combination thereof. System memory 406 may include an operating system 420, one or more applications 422, and program data 424. Application 422 may include an optical lithography using a graphene contrast enhancement layer algorithm 426 that is arranged to perform the functions as described herein including those described with respect to system 100 of FIGS. 1-3. Program data 424 may include optical lithography using a graphene contrast enhancement layer data 428 that may be useful for implementing optical lithography using a graphene contrast enhancement layer as is described herein. In some embodiments, application 422 may be arranged to operate with program data 424 on operating system 420 such that implementing optical lithography using a graphene contrast enhancement layer may be provided. This described basic configuration 402 is illustrated in FIG. 4 by those components within the inner dashed line.

Computing device 400 may have additional features or functionality, and additional interfaces to facilitate communications between basic configuration 402 and any required devices and interfaces. For example, a bus/interface controller 430 may be used to facilitate communications between basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program, modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc) or other peripheral devices (e.g., printer, scanner, etc.) via one or more I/O ports 458. An example communication device 446 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 400 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate front the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, ever when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system effective to form a structure, the system comprising:
   a processor;
   a light source arranged in communication with the processor;
   a mask, wherein the mask includes a pattern;
   a substrate;
   a photoresist layer on the substrate; and
   a graphene layer on the photoresist layer;
   wherein the processor is configured effective to:
      apply light through the mask to the graphene layer, wherein the light is effective to form the pattern on the photoresist layer though the graphene layer; and
      remove the graphene layer from the photoresist layer with use of a dry etching technique.

2. The system as recited in claim 1, further comprising an optical system disposed between the mask and the graphene layer, wherein the optical system is configured effective to refract the light and change a magnification of the pattern between the mask and the substrate.

3. The system as recited in claim 1, further comprising:
a first table, wherein the mask is disposed on the first table;
a second table, wherein the substrate is disposed on the second table; and
wherein the first table is movable with respect to the second table.

4. The system as recited in claim 3, wherein:
the processor is arranged in communication with the first table and the second table; and
the processor is configured effective to control the first table to move with respect to the second table.

5. The system as recited in claim 1, wherein the light source is effective to output light with a wavelength of about 157 nm.

6. The system as recited in claim 1, wherein the light source is effective to output light with a wavelength of about 193.

7. The system as recited in claim 1, wherein the light source is effective to output light with a wavelength of about 12 m.

8. The system as recited in claim 1, wherein the photoresist includes a silylating agent.

9. The system as recited in claim 1, wherein:
the graphene layer has a first width and a first length;
the photoresist layer has a second width and a second length;
the first width is substantially equal to the second width; and
the first length is substantially equal to the second length.

10. The system as recited in claim 1, wherein the graphene layer has a height of about one atom.

11. The system as recited in claim 1, wherein the graphene layer is effective to absorb at least some of the light to function as an antireflective layer.

12. The system as recited in claim 1, wherein the graphene layer includes a bandgap of approximately 0.1 EV.

13. The system as recited in claim 1, wherein the processor is further effective to control application of an oxygen plasma to the graphene layer, wherein the oxygen plasma is effective to remove the graphene layer.

14. The system as recited in claim 1, wherein:
the graphene layer has a first width and a first length;
the photoresist layer has a second width and a second length;
the first width is substantially equal to the second width;
the first length is substantially equal to the second length; and
the graphene layer has a height of about one atom.

15. The system as recited in claim 1, wherein the graphene layer is effective to absorb at least some of the light to function as an antireflective layer and the graphene layer includes a bandgap of approximately 0.1 EV.

16. A structure comprising:
a substrate;
a patterned photoresist layer on the substrate; and
an exposed graphene layer on the patterned photoresist layer, wherein the patterned photoresist layer is formed by application of a light through a mask that includes the pattern and application of the light through the exposed graphene layer prior to removal of the exposed graphene from the photoresist layer with use of a dry etching technique.

17. The structure as recited in claim 16, wherein the substrate includes a silylating agent.

18. The structure as recited in claim 16, wherein:
the graphene layer has a first width and a first length;
the photoresist layer has a second width and a second length;
the first width is substantially equal to the second width; and
the first length is substantially equal to the second length.

19. The structure as recited in claim 18, wherein the graphene layer has a height of about one atom.

20. The structure as recited in claim 16, wherein the dry etching technique includes application of an oxygen plasma to the exposed graphene layer, wherein the oxygen plasma is effective to remove the graphene layer.

21. A system effective to form a structure, the system comprising:
a processor;
a light source arranged in communication with the processor; and
a mask, wherein the mask includes a pattern;
wherein the processor is configured effective to:
apply light through the mask to a graphene layer, wherein the light is effective to form the pattern on a photoresist layer though the graphene layer; and
remove the graphene layer from the photoresist layer with use of a dry etching technique.

* * * * *

UNITED STATES PATENT AND TRADEMARK OFFICE
CERTIFICATE OF CORRECTION

PATENT NO. : 8,773,636 B2  
APPLICATION NO. : 13/950923  
DATED : July 8, 2014  
INVENTOR(S) : Yager et al.

Page 1 of 1

It is certified that error appears in the above-identified patent and that said Letters Patent is hereby corrected as shown below:

In the Drawings:

In Fig. 4, Sheet 4 of 4, delete "I/O PORT(S) (456)" and insert -- I/O PORT(S) (458) --, therefor.

In Fig. 4, Sheet 4 of 4, delete "COMMUNICATION DEVICES (444)" and insert -- COMMUNICATION DEVICES (446) --, therefor.

In the Specifications:

In Column 2, Line 28, delete "to the" and insert -- in the --, therefor.

In Column 3, Line 64, delete "layer 134." and insert -- layer 114. --, therefor.

In Column 4, Line 11, delete "Saver" and insert -- layer --, therefor.

In Column 6, Line 46, delete "etc)" and insert -- etc.) --, therefor.

In Column 7, Line 52, delete "ever" and insert -- even --, therefor.

Signed and Sealed this
Eleventh Day of November, 2014

Michelle K. Lee
*Deputy Director of the United States Patent and Trademark Office*

UNITED STATES PATENT AND TRADEMARK OFFICE
CERTIFICATE OF CORRECTION

PATENT NO.         : 8,773,636 B2               Page 1 of 1
APPLICATION NO.    : 13/950923
DATED              : July 8, 2014
INVENTOR(S)        : Thomas A. Yager It is certified that error appears in the above-identified patent and that said Letters Patent is hereby corrected as shown below:

On the Title Page, in item (71), under "Applicant", Line 1, delete ",", therefor.

On the Title Page, in item (73), under "Assignee", Line 1, delete ",", therefor.

On the Title Page, in item (62), under "Related U.S. Application Data", Line 2, after "8,512,936" and before the "." that follows thereafter, insert -- , which is a 371 application of PCT/US10/50668, filed Sept. 29, 2010 --, therefor.

In the Specification

In Column 1, under "CROSS REFERENCE TO RELATED APPLICATIONS", Lines 9-10, in between "2010," and "the entirety" insert -- which is a 371 application of PCT/US10/50668, filed Sept. 29, 2010, --, therefor.

Signed and Sealed this
Twenty-fourth Day of March, 2015

Michelle K. Lee
*Director of the United States Patent and Trademark Office*